(12) United States Patent
Lim

(10) Patent No.: US 7,642,613 B2
(45) Date of Patent: Jan. 5, 2010

(54) CMOS IMAGE SENSOR AND METHOD FOR FABRICATING THE SAME

(75) Inventor: Keun Hyuk Lim, Seoul (KR)

(73) Assignee: Dongbu Electronics, Inc., Seoul (KR)

( * ) Notice: Subject to any disclaimer, the term of this patent is extended or adjusted under 35 U.S.C. 154(b) by 0 days.

(21) Appl. No.: 12/078,552

(22) Filed: Apr. 1, 2008

(65) Prior Publication Data

US 2008/0185622 A1 Aug. 7, 2008

Related U.S. Application Data

(62) Division of application No. 11/319,587, filed on Dec. 29, 2005, now Pat. No. 7,390,686.

(30) Foreign Application Priority Data

Dec. 30, 2004 (KR) ...................... 10-2004-0116522

(51) Int. Cl.
*H01L 31/00* (2006.01)
(52) U.S. Cl. .................. 257/431; 257/432; 257/437
(58) Field of Classification Search .................. 257/431, 257/432, 434, 436, 437
See application file for complete search history.

(56) References Cited

U.S. PATENT DOCUMENTS 5,172,206 A 12/1992 Iizuka
6,507,083 B1 1/2003 Tian
6,995,800 B2 2/2006 Takahashi et al.
7,084,056 B2 8/2006 Won
7,193,289 B2 * 3/2007 Adkisson et al. ............ 257/431
2005/0250242 A1 11/2005 Chen
2007/0052053 A1 3/2007 Lee

FOREIGN PATENT DOCUMENTS

CN 1518119 A 8/2004
KR 1020010059316 7/2001

* cited by examiner

*Primary Examiner*—Kevin M Picardat
(74) *Attorney, Agent, or Firm*—McKenna Long & Aldridge LLP

(57) ABSTRACT

A CMOS image sensor and a method for fabricating the same are disclosed, in which light that transmits through a microlens is prevented from being beyond a photodiode region to minimize loss of incident light and to improve low illumination characteristics of the CMOS image sensor. The CMOS image sensor includes a semiconductor substrate including a transistor region and a photodiode region, a gate electrode formed on the semiconductor substrate corresponding to the transistor region, an interlayer dielectric layer formed on an entire surface of the semiconductor substrate including the gate electrode, a microlens formed over the interlayer dielectric layer to condense light, and a metal barrier formed in the interlayer dielectric layer to surround a portion of the interlayer dielectric layer corresponding to the photodiode region and to reflect light in the photodiode region that transmits through the microlens but goes beyond the photodiode region.

5 Claims, 3 Drawing Sheets

CMOS IMAGE SENSOR AND METHOD FOR FABRICATING THE SAME

This application is a divisional of application Serial No. 11/319,587, filed Dec. 29, 2005 now U.S. Pat. No. 7,390,686, now allowed, which claims the benefit of Korean Patent Application No. 10-2004-0116522, filed on Dec. 30, 2004, both of which are hereby incorporated by reference for all purposes as if fully set forth herein.

BACKGROUND OF THE INVENTION

1. Field of the Invention

The present invention relates to a complementary metal-oxide semiconductor (CMOS) image sensor and a method for fabricating the same, and more particularly, to a CMOS image sensor and a method for fabricating the same in which a metal barrier is formed to surround a periphery of a photodiode region so as to reduce loss of light that transmits through a microlens, thereby improving light-receiving efficiency of the photodiode region.

2. Discussion of the Related Art

Generally, a CMOS image sensor employs a switching mode that sequentially detects outputs of unit pixels using MOS transistors. The MOS transistors are formed in a semiconductor transistor to correspond to the number of unit pixels using CMOS technology that uses a control circuit and a signal processing circuit as peripheral circuits. That is, to display images, the CMOS image sensor sequentially detects the electrical signals of the respective unit pixels in the switching mode by forming a photodiode and MOS transistors in each unit pixel.

Since the CMOS image sensor uses CMOS technology, it has advantages in that low power consumption is required and process steps are simplified due to a relatively small number of photo processes. Also, the CMOS image sensor has an advantage in that a control circuit, a signal processing circuit, and an analog-to-digital converter can be integrated in one chip to easily obtain a slim sized device.

FIG. 1 is a structural sectional view illustrating incident light to a photodiode region in a related art CMOS image sensor.

As shown in FIG. 1, the related art CMOS image sensor includes a semiconductor substrate 10 including a photodiode region 10a, a device isolation film 11 formed in the semiconductor substrate 10 to isolate devices from each other, a gate electrode 21 formed on a transistor region of the semiconductor substrate 10, source and drain regions 12 formed in the semiconductor substrate 10 at both sides of the gate electrode 21, an interlayer dielectric layer 20 formed on an entire surface of the semiconductor substrate 10 including the gate electrode 21, a first metal line 40 formed on the interlayer dielectric layer 20, a first contact 30 formed in the interlayer dielectric layer 20 to electrically connect the gate electrode 21 with the first metal line 40, an inter-metal dielectric layer 50 formed on an entire surface of the interlayer dielectric layer 20, a second metal line 70 formed on the inter-metal dielectric layer 50, a second contact 60 formed in the inter-metal dielectric layer 50 to electrically connect the first metal line 40 with the second metal line 70, an oxide layer 80 formed on the inter-metal dielectric layer 50 including the second metal line 70, a nitride layer 90 formed on the oxide layer 80, and a microlens 100 formed on the nitride layer 90 to condense light.

The aforementioned related art CMOS image sensor condenses light through the microlens 100 and transfers the condensed light to the photodiode region 10a of the semiconductor substrate 10 such that the condensed light is stored as an electrical signal in the photodiode region 10a. Therefore, a focal plane of the microlens 100 serves as a main factor that determines low illumination characteristics of the CMOS image sensor.

However, the related art CMOS image sensor has a drawback. If the focus of the microlens 100 is not exact, loss of the light condensed by the microlens 100 may occur. That is, as shown in FIG. 1, if the distance between the microlens 100 and the photodiode region 10a is longer than the originally designed distance, or if the focal distance of the microlens 100 becomes shorter than intended without being uniformly maintained, the light condensed by the microlens 100 may partially be beyond the photodiode region 10a, thereby causing loss of the light.

SUMMARY OF THE INVENTION

Accordingly, the present invention is directed to a CMOS image sensor and a method for fabricating the same that substantially obviates one or more problems due to limitations and disadvantages of the related art.

An advantage of the present invention is to provide a CMOS image sensor and a method for fabricating the same in which a metal barrier is formed to surround a periphery of a photodiode region to reflect light in the photodiode region that may be lost from the photodiode region, thereby improving a light-receiving efficiency of the photodiode region and low illumination characteristics.

Another advantage of the present invention is to provide a CMOS image sensor and a method for fabricating the same in which a metal contact electrically connecting a gate electrode with a metal line is formed of the same material as that of a metal barrier so that the metal contact and the metal barrier can simultaneously be formed by one process without a separate additional process.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the invention, as embodied and broadly described herein, a CMOS image sensor according to the present invention includes a semiconductor substrate including a transistor region and a photodiode region, a gate electrode formed on the semiconductor substrate corresponding to the transistor region, an interlayer dielectric layer formed on an entire surface of the semiconductor substrate including the gate electrode, a microlens formed over the interlayer dielectric layer to condense light, and a metal barrier formed in the interlayer dielectric layer to surround a portion of the interlayer dielectric layer corresponding to the photodiode region and to reflect light in the photodiode region that transmits through the microlens but goes beyond the photodiode region.

In another aspect of the present invention, the CMOS image sensor further includes a metal line formed between the interlayer dielectric layer and the microlens, and a contact formed in the interlayer dielectric layer to electrically connect the gate electrode with the metal line.

In another aspect of the present invention, the metal barrier and the contact are formed of the same metal.

In another aspect of the present invention, the metal barrier and the contact are formed of W or Al.

In another aspect of the present invention, a method for fabricating a CMOS image sensor includes forming a gate electrode on a transistor region of a semiconductor substrate including the transistor region and a photodiode region, forming an interlayer dielectric layer on an entire surface of the semiconductor substrate including the gate electrode, forming a microlens over the interlayer dielectric layer to condense light, and forming a metal barrier in the interlayer dielectric layer to surround a portion of the interlayer dielectric layer corresponding to the photodiode region and to reflect light to the photodiode region that transmits through the microlens but goes beyond the photodiode region.

In another aspect of the present invention, the method further includes forming a metal line between the interlayer dielectric layer and the microlens, and forming a contact in the interlayer dielectric layer to electrically connect the gate electrode with the metal line.

In another aspect of the present invention, the metal barrier and the contact are formed of the same metal.

In another aspect of the present invention, the metal barrier and the contact are formed of W or Al.

In another aspect of the present invention, the metal barrier and the contact are simultaneously formed.

In another aspect of the present invention, the metal barrier and the contact are simultaneously formed by forming a photoresist pattern on the interlayer dielectric layer, selectively etching the interlayer dielectric layer using the photoresist pattern as a mask to respectively form a metal barrier hole and a contact hole, and respectively forming the metal barrier and the contact in the metal barrier hole and the contact hole.

In another aspect of the present invention, the interlayer dielectric layer is etched by an anisotropic etching process.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or like parts.

Figure 1:
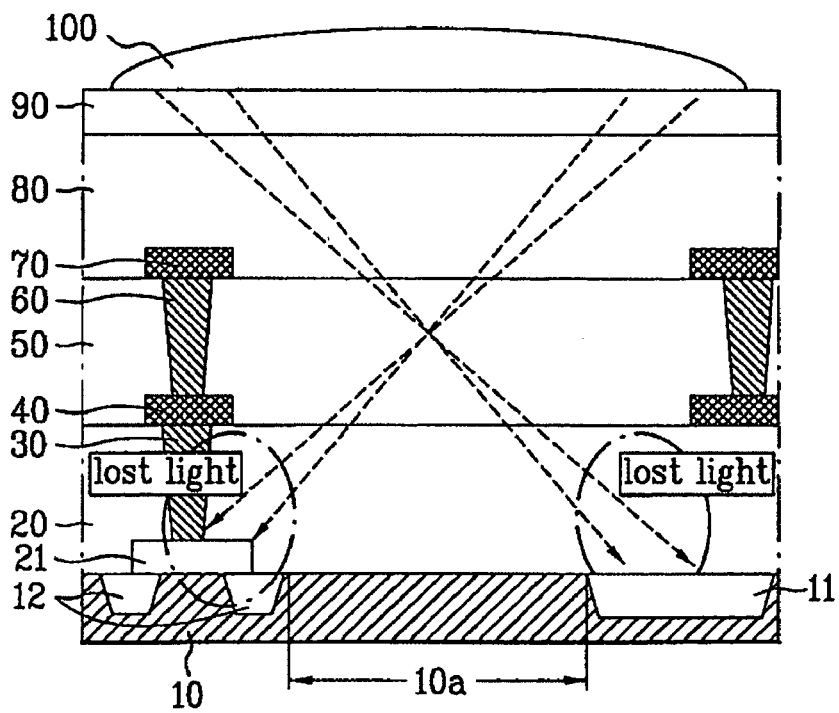
FIG. 1 is a sectional view illustrating incident light to a photodiode region in a related art CMOS image sensor.
Figure 2:
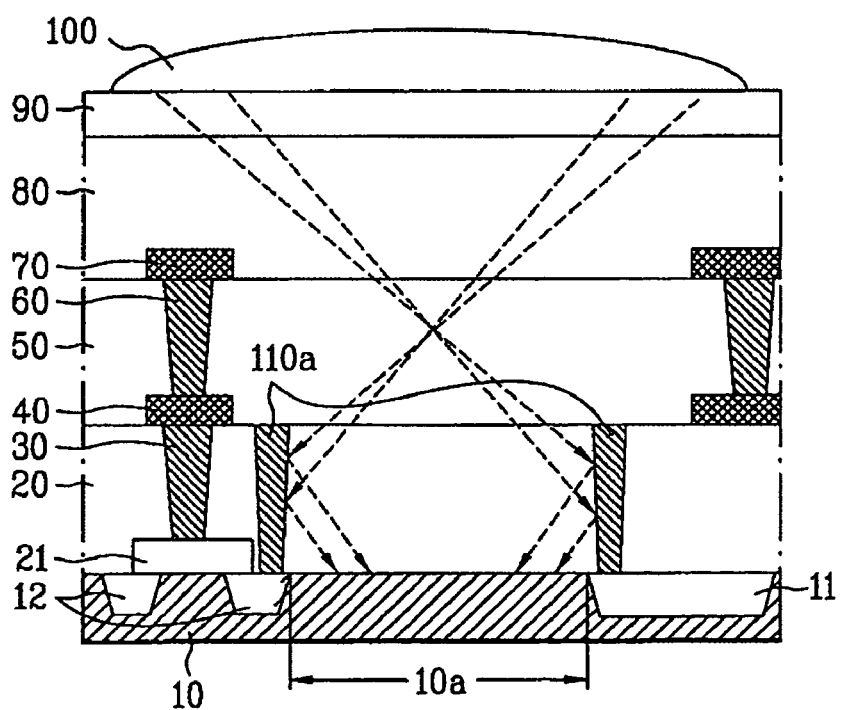
FIG. 2 is a sectional view illustrating incident light to a photodiode region in a CMOS image sensor according to the present invention.

As shown in FIG. 2, the CMOS image sensor according to the present invention includes a semiconductor substrate 10. The semiconductor substrate 10 is defined by a transistor region, an active region including a photodiode region 10a, and a device isolation region that isolates devices from each other. The device isolation region is provided with a device isolation film 11 formed by a shallow trench isolation (STI) to isolate devices from each other. The transistor region is provided with a transistor that includes a gate electrode 21 and source and drain regions 12. The photodiode region 10a is provided with a photodiode (not shown) that generates charges depending on incident light. The transistor transmits and receives an electrical signal to and from a first metal line 40. An interlayer dielectric layer 20 is formed between the first metal line 40 and the transistor. The first metal line 40 is electrically connected with the gate electrode 21 and the source and drain regions 12 through a first contact 30 formed in the interlayer dielectric layer 20.

Also, a metal barrier 110a is formed in the interlayer dielectric layer 20 to surround a portion of the interlayer dielectric layer 20 corresponding to the photodiode region 10a. As shown in FIG. 2, light that transmits through a microlens 100 but is lost from the photodiode region 10a due to a focal error of the microlens 100 is reflected in the photodiode region 10a by the metal barrier 110a. Therefore, the lost light enters the photodiode region through the metal barrier 110a. As a result, the light that transmits through the microlens is efficiently used and low illumination characteristics of the CMOS image sensor are improved.

In one embodiment of the present invention, the metal barrier 110a is formed of the same material as that of the first contact 30. This enables the first contact 30 and the metal barrier 110a to be simultaneously formed by one process. The metal barrier 110a and the first contact 30 are preferably formed of W or Al or any metal having excellent electrical conductivity and excellent reflexibility. In another embodiment of the present invention, the metal barrier 110a may be formed of a metal different from that of the first contact 30. Additionally, the barrier 110a and the first contact 30 may be formed in separate steps.

The CMOS image sensor of the present invention further includes an inter-metal dielectric layer 50 formed on an entire surface of the interlayer dielectric layer 20 including the first metal line 40, a second metal line 70 formed on the inter-metal dielectric layer 50, a second contact 60 formed in the inter-metal dielectric layer 50 to electrically connect the first metal line 40 with the second metal line 70, an oxide layer 80 formed on the inter-metal dielectric layer 50 including the second metal line 70 to protect the device from humidity and scratches, a nitride layer 90 formed on the oxide layer 80, and a microlens 100 formed on the nitride layer 90 to condense light.

A method for fabricating the CMOS image sensor according to the present invention will be described with reference to FIG. 3 to FIG. 5.

Figure 3:
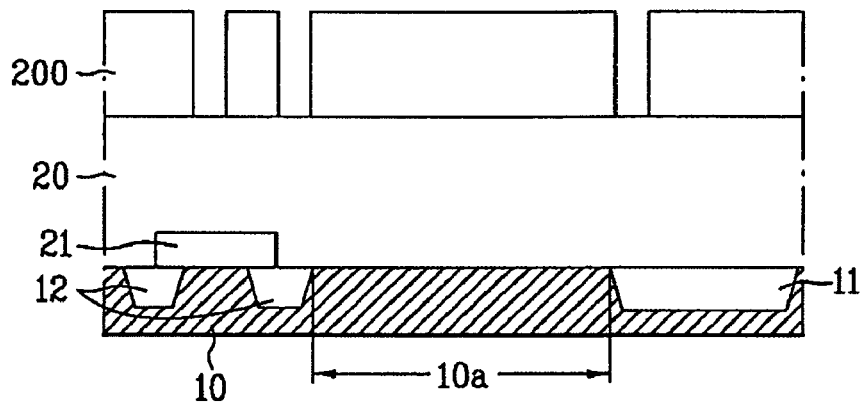
FIG. 3 to FIG. 5 are sectional views illustrating process steps of a CMOS image sensor according to the present invention.

As shown in FIG. 3, the interlayer dielectric layer 20 is formed on the semiconductor substrate 10 in which the transistor including the gate electrode 21 and the source and drain regions 12, the photodiode region 10a including a photodiode that generates charges using incident light, and the device isolation film 11 are formed. A photoresist is deposited on the interlayer dielectric layer 20 and then exposed and developed to form a photoresist pattern 200.

Figure 4:
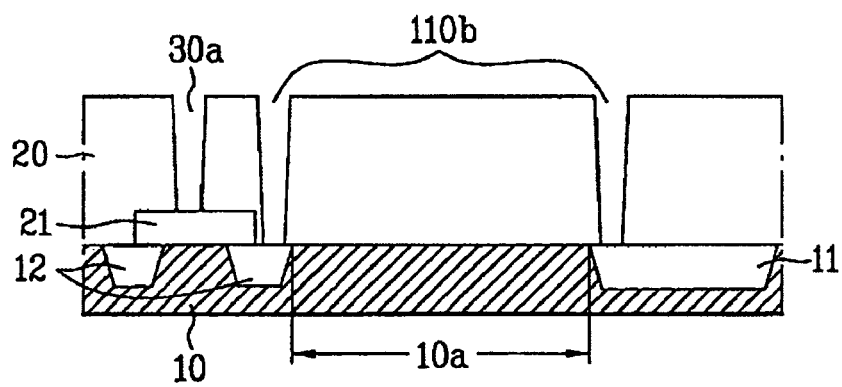

As shown in FIG. 4, the interlayer dielectric layer 20 is selectively etched using the photoresist pattern 200 as a mask to respectively form a metal barrier hole 110b and a contact hole 30a. The metal barrier hole 110b is formed to surround a portion of the interlayer dielectric layer 20 corresponding to the photodiode region 10a. Meanwhile, the interlayer dielectric layer 20 is preferably etched by an anisotropic etching process.

Figure 5:
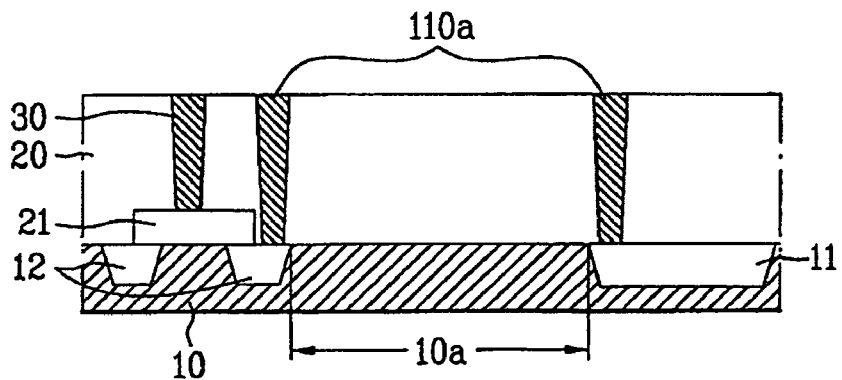

Subsequently, as shown in FIG. 5, a metal layer is deposited on the entire surface of the interlayer dielectric layer 20 including the metal barrier hole 110b and the contact hole 30a. Then, the metal layer is etched until the interlayer dielectric layer 20 is exposed, so that the metal barrier 110a and the first contact 30 are respectively formed in the metal barrier hole 110b and the contact hole 30a. The first contact 30 electrically connects the first metal line 40 with the transistor. Therefore, the first contact 30 should have excellent electrical conductivity. The metal barrier 110a reflects the light that transmits through the microlens 100 in the photodiode region 10a so as not to allow the light to be beyond the photodiode region 10a. Therefore, the metal layer is preferably formed of W or Al or any metal having excellent electrical conductivity and excellent reflexibility. The metal layer may be etched by an isotropic etching process.

Figure 6:
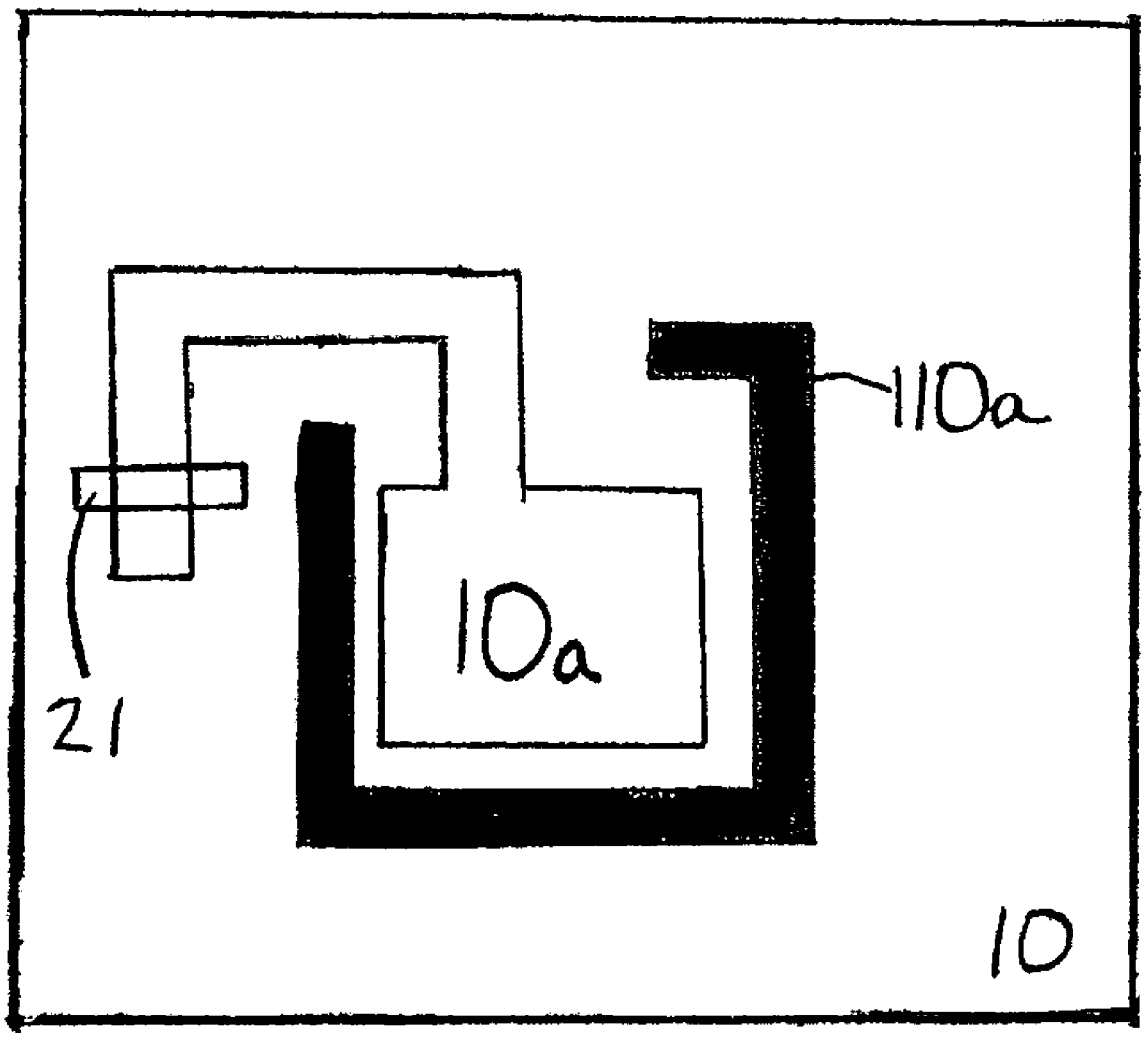
FIG. 6 is a plan view of a CMOS image sensor according to the present invention.

As shown in FIG. 6, the metal barrier 110a is formed around the photodiode region 10a. This enables the metal barrier 110a to reflect the light that transmits through the microlens 100 in the photodiode region 10a so as not to allow the light to be beyond the photodiode region 10a.

Conventional processes may then be performed. Thus, the first metal line 40 is formed on the interlayer dielectric layer 20 to correspond to the first contact 30. The inter-metal dielectric layer 50 is formed on the entire surface of the interlayer dielectric layer 20 including the first metal line 40. The second contact 60 is formed in the inter-metal dielectric layer 50. The second metal line 70 electrically connected with the first metal line 40 through the second contact 60 is formed on the inter-metal dielectric layer 50 to correspond to the second contact 60. The oxide layer 80 and the nitride layer 90 are sequentially formed on the entire surface of the inter-metal dielectric layer 50 including the second metal line 70 to protect the device from humidity and scratches. The microlens 100 is formed on the nitride layer 90 to correspond to the photodiode region 10a.

As described above, the CMOS image sensor and the method for fabricating the same have the following advantages.

Since the light that transmits through the microlens is prevented from being beyond the photodiode region, it is possible to minimize loss of the incident light and improve low illumination characteristics of the CMOS image sensor. In addition, since the metal barrier that reflects the light in the photodiode region and the contact that electrically connects the metal line with the transistor are formed by one process, it is possible to improve low illumination characteristics without a separate additional process and minimize loss of light, thereby reducing a dark current caused by the loss of light.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A CMOS image sensor comprising:
    a semiconductor substrate including a transistor region and a photodiode region;
    a gate electrode formed on the semiconductor substrate corresponding to the transistor region;
    an interlayer dielectric layer formed on an entire surface of the semiconductor substrate including the gate electrode;
    a microlens formed over the interlayer dielectric layer to condense light;
    a metal barrier formed in the interlayer dielectric layer to surround a portion of the interlayer dielectric layer corresponding to the photodiode region and to reflect light in the photodiode region that transmits through the microlens but goes beyond the photodiode region;
    a metal line formed between the interlayer dielectric layer and the microlens; and
    a contact formed in the interlayer dielectric layer to electrically and directly connect the gate electrode with the metal line.

2. The CMOS image sensor of claim 1, wherein the metal barrier and the contact are formed of the same metal.

3. The CMOS image sensor of claim 2, wherein the metal barrier and the contact are formed of W or Al.

4. The CMOS image sensor of claim 1, wherein the metal barrier and the contact are formed of different metals.

5. The CMOS image sensor of claim 4, wherein the metal barrier and the contact are formed of W or Al.

* * * * *